United States Patent [19]

Pearce et al.

[11] Patent Number: 4,785,418
[45] Date of Patent: Nov. 15, 1988

[54] PROPORTIONAL AUTOMATIC GAIN CONTROL

[75] Inventors: Harold B. Pearce; Lynn P. West, both of Austin, Tex.

[73] Assignee: International Business Machines Corporation, Armonk, N.Y.

[21] Appl. No.: 901,904

[22] Filed: Aug. 29, 1986

[51] Int. Cl.⁴ .............................................. G06F 7/38
[52] U.S. Cl. ................................. 364/715.01; 375/98
[58] Field of Search ............... 364/715, 157, 161, 162, 364/163; 330/129, 138, 279, 280; 375/98; 455/245

[56] References Cited

U.S. PATENT DOCUMENTS

| | | | |
|---|---|---|---|
| 3,562,504 | 2/1971 | Harris | 235/310 |
| 3,969,683 | 7/1976 | Fabricius | 330/129 X |
| 3,996,519 | 12/1976 | Wagner | 375/23 |
| 4,191,995 | 3/1980 | Farrow | 364/113 |
| 4,213,097 | 7/1980 | Chiu et al. | 330/129 X |
| 4,224,578 | 9/1980 | Bernitt | 330/129 X |
| 4,464,723 | 8/1984 | Chartier | 364/571 |
| 4,477,698 | 10/1984 | Szlam et al. | 379/377 |
| 4,499,586 | 2/1985 | Cafarella et al. | 375/98 |

Primary Examiner—Gary V. Harkcom
Assistant Examiner—Tan V. Mai
Attorney, Agent, or Firm—J. F. Villella, Jr.; H. St. Julian

[57] ABSTRACT

Automatic gain control in a digital signal processor. An incoming electrical signal is sampled and multiplied by a gain factor with the resulting product compared to a constantly changing maximum value. If the magnitude of the changing maximum value lies outside a predetermined range of values, then the gain factor is adjusted proportionally to the error calculated by the amount the maximum value is outside the threshold range. In an alternative embodiment, the gain is adjusted according to whether or not one of the resulting products lies outside such upper and lower threshold range. The running maximum value decays with time in order to allow the automatic gain control to rack a signal which slowly weakens in strength. A time dependent factor enables the gain to be adjusted much more radically when a signal is first received.

18 Claims, 3 Drawing Sheets

PROPORTIONAL AUTOMATIC GAIN CONTROL

DESCRIPTION

1. Technical Field

This invention relates generally to automatic gain control, and more particularly, to proportional automatic gain control in a digital signal processor.

2. Background Art

The automatic adjustment of the gain of an incoming electrical or acoustical signal prior to further signal processing is known in the prior art. Typically, automatic gain control (AGC) mechanisms are implemented in hardware using non-linear devices, such as diodes to compand the incoming signal. In digital signal processing, such non-linear devices are not available. Normally, a digital signal processor accomplishes AGC by performing arithmetic division. A drawback with the use of arithmetic division is that it requires significant amounts of the processing capability of the digital signal processor.

AGC mechanisms are normally used in devices which receive amplitude varying signals. The following are examples of such amplitude varying signals: speech from a microphone wherein the distance between the microphone and the speaker changes or where individual speakers talk at varying amplitudes; speech from a telephone line wherein the sources of variation may be due to both the speaker and the varying telephone line; and, modem signals from a telephone line, since the amplitude attenuation of any one telephone line may be different from other telephone lines. AGC mechanisms are helpful to limit the dynamic range over which most of the most complex portion of the signal processing must work, i.e., to prevent amplifiers from saturating from high level signals while at the same time minimizing the effects of thermal noise introduced by circuitry, or quantizing noise in the case of a digitized signal.

As mentioned previously, the non-linear effects commonly employed in hardware implementations are not available in a digital signal processor. An AGC process in such a processor uses division. Typically, the input signal level, which is usually the largest sample over a period of time, is determined, and then arithmetic inversion is performed. All subsequent incoming samples over a period of time are then multiplied by this inverted value. Consequently, large incoming signals are multiplied by a small AGC value, and small incoming signals are multiplied by a large AGC value. A problem with current signal processors is that division is performed rather inefficiently. As a result, large amounts of the processing power of a digital signal processor is employed just for automatic gain control. In a telephony environment, this leaves critical functions such as dual-tone multi-frequency (DTMF) detection, demodulation, call progress, and telephone line monitor with reduced processing capability.

U.S. Pat. No. 4,191,995 shows a typical digital AGC circuit implemented in hardware. The circuit includes both an analog attenuator and a digital attenuator for applying controlled attenuation to the input analog signal and the digital representation of said input signal, respectively. The analog and digital attenuators operate under control of a digital control circuit.

U.S. Pat. No. 3,996,519 also discloses a digital signal processor having automatic gain control implemented in hardware. The processor disclosed therein utilizes two parity generators, a set-reset flip-flop shift register and logic to control the output of a serially connected shift register.

U.S. Pat. No. 4,499,586 describes a microprocessor controlled automatic gain control used in a receiver for receiving recurring first and second scanning signals. The apparatus includes a linear and a logarithmic amplifier. Means are provided for generating a digital gain control signal in response to a peak magnitude signal with a D/A convertor for converting digital gain control signals into analog gain control signals which are then applied to the gain control input of a linear amplifier.

U.S. Pat. No. 4,477,698 discloses an apparatus for detecting pickup at a remote telephone set. The apparatus uses a high gain band pass filter with no automatic gain control employed. Although the apparatus is able to detect telephone call pickup, it is unable to compensate for different speech levels and/or modem signal levels which would require automatic gain control.

As is well known, certain kinds of electrical signals are amplitude constrained. For such signals, a window size can be described such that the peak signal within that window will never exceed a first threshold level, nor will it be less than a second threshold level. Examples of such amplitude constrained signals are dial-tone signals, FSK modem signals, PSK modem signals, and finally, QAM modem signals. Examples of unconstrained signals are speech and telephone line busy signals. For either of these latter unconstrained signals, long periods of silence, i.e., no signals, are possible.

An example of an AGC mechanism used to process unconstrained signals is found in U.S. patent application, Ser. No. 786,911, filed Oct. 11, 1985, now U.S. Pat. No. 4,747,065, and assigned to the assignee of the present invention. In this application, AGC is accomplished by measuring an incoming signal against one or more thresholds and adjusting the gain according to a threshold crossing. For unconstrained signals such as speech and telephone line busy signals, the technique of the aforementioned application works very well. However, for high speed modem signals, the technique has drawbacks. With amplitude constrained signals such as are found in high speed modems, there is a small window that the gain can be adjusted in because the incoming signals are changing quite rapidly. As a result, the gain has to be adjusted very rapidly and in an adaptive manner. As a result, the aforementioned AGC technique found in the filed patent application is not sufficient to handle the high speed modem signals. A further problem that arises when dealing with high speed modem signals is that amplitude jitter can often cause errors in the data received from the incoming electrical signal. Consequently, an AGC mechanism for handling high speed signals must adapt its gain levels quite rapidly and must not introduce jitter into the received signal.

DISCLOSURE OF THE INVENTION

Accordingly, it is an object of this invention to provide improved automatic gain control in a digital signal processor.

It is another object of this invention to provide automatic gain control in a digital signal processor without the use of non-linear hardware devices.

It is still another object of this invention to provide proportional automatic gain control in a digital signal processor for handling high speed amplitude constrained signals.

In accordance with these and other objects of the invention, proportional automatic gain control is provided in a digital signal processing environment to provide automatic gain control (AGC) for amplitude constrained signals such as are found in high speed modems. The automatic gain control of the present invention is divided into two distinct modes, lock-in mode and tracking mode. Lock-in mode, which occurs in the first few milliseconds after the incoming signal is received, makes a determination of the incoming signal strength and compensates for it. At the end of the lock-in time window, the output of the AGC is substantially stable. The objective of the tracking mode is to determine the incoming signal strength over a rather long time period and compensate for any changes in such signal strength. During lock-in mode, the gain controller compensates for a widely varied signal strength within a very short time period. In the best mode described herein, such gain controller during lock-in mode compensates for a signal strength from −10 dBm to −40 dBm within a 40 millisecond time period. During tracking mode, the gain controller distinguishes between a change in signal strength due to amplitude modulation from a change in signal strength due to the dynamic nature of a switched telephone network. During this tracking mode time period, the gain controller is also insensitive to noise that occurs on the incoming signal.

The incoming electrical signal is sampled by a front end filter and each sample is multiplied by a present gain factor. The magnitude of the resulting product is compared to a constantly changing maximum. If the magnitude of any one of the resultant products is greater than the present maximum, then a new maximum is established. The maximum value is then compared to an upper and lower threshold. If the maximum does not lie within these two thresholds, then the gain factor is adjusted proportional to the error calculated by the amount the signal is outside the threshold range. The gain is updated much more rapidly and radically at the beginning of the receipt of an incoming signal in order to facilitate lock-in. The changing maximum value decays with time in order to allow the AGC to track a signal which slowly weakens in strength.

BEST MODE FOR CARRYING OUT THE INVENTION

Figure 1:
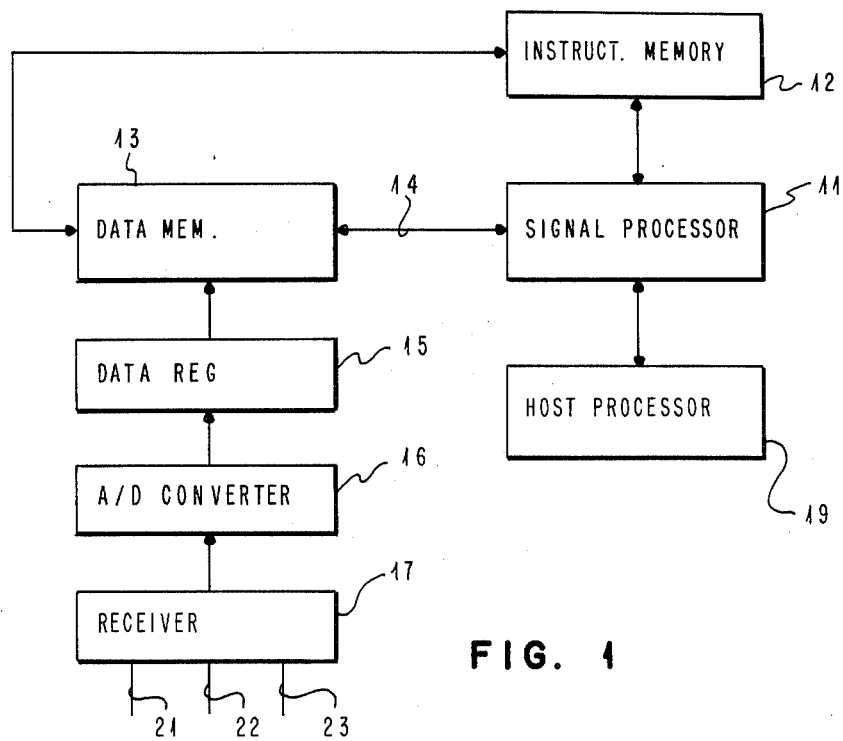
FIG. 1 is a functional block diagram of the system according to the present invention.

A simplified functional block diagram is shown in FIG. 1. Signal processor 11 may be any commercially available signal processor. An example of such a signal processor is the Texas Instruments TMS32010. Signal processor 11 is totally controlled by host processor 19 and must have its central processing unit (CPU) instructions loaded before operation. Signal processor 11 uses instruction memory 12 as well as data memory 13. Both of these memories, i.e., instruction memory 12 and data memory 13 are accessible by host processor 19 although not at the same time as signal processor 11. Instruction memory 12 is accessible by host processor 19 only when signal processor 11 is turned off, i.e., reset. At that time, host processor 19 can load from instruction memory 12 and then switch to data memory 13, which is shared at all times dynamically with signal processor 11. Both signal processor 11 and host processor 19 have the capability to interrupt one another with interrupt masking under control of host processor 19. Incoming high-speed modem signals are input over lines 21–23 to receiver 17. These signals, which vary in amplitude are amplitude constrained signals such as from FSK modems, PSK modems, and QAM modems. These incoming high-speed modem signals, which are in analog format, are converted to digital by A/D convertor 16 and temporarily stored in data register 15. These digitized signals are then input to data memory 13. A/D convertor 16 provides digitized samples of the analog signals input over lines 21–23. It is these digitized samples which are stored in data memory 13 and which are amplitude adjusted, thereby providing proportional automatic gain control using signal processor 11. In the best mode described herein, the incoming high-speed modem signals are sampled at 9600 Hertz. The symbol time of the incoming modulated signals is 1.6 milliseconds which insures a symbol every 16 samples.

Figure 2:
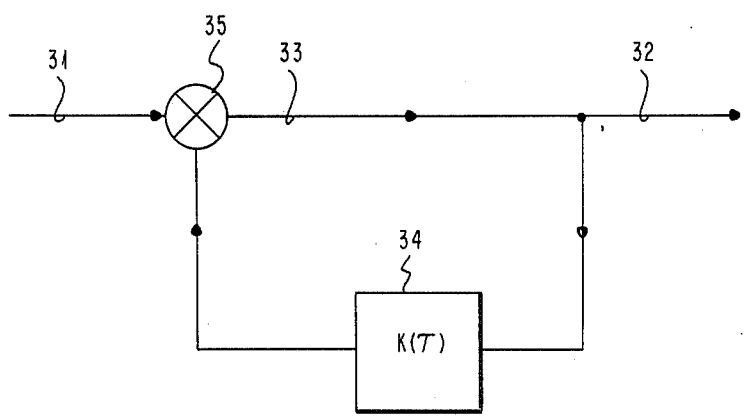
FIG. 2 is a functional block diagram of the gain adjusting mechanism.
Figure 3:
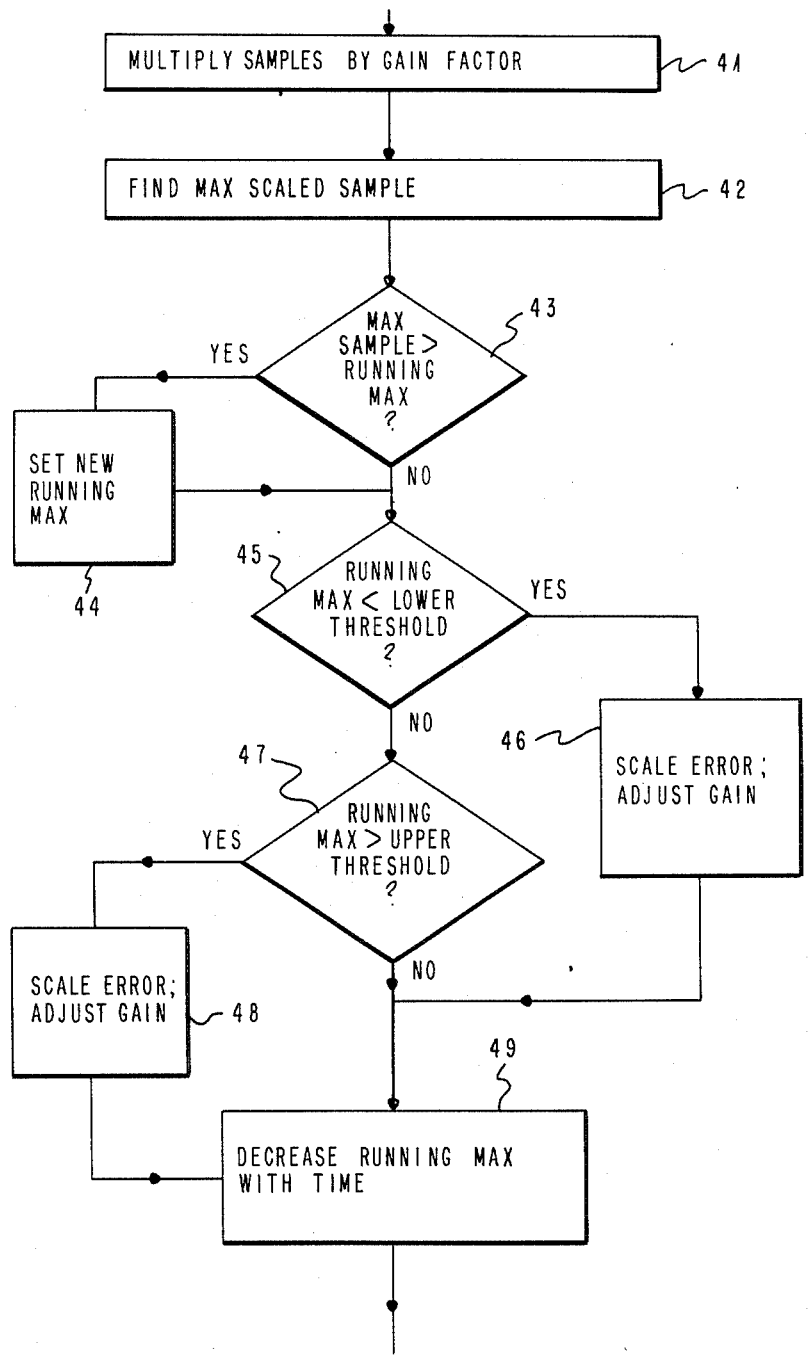
FIG. 3 is a flow chart depicting the operation of the preferred embodiment of the present invention.

A standard feedback loop is shown in FIG. 2. This feedback loop is used to describe the adjustment of the gain with time as an input signal is received. As clearly shown in block 34 of the feedback loop, the gain K(t) is a function of time. The input 31 to the feedback loop is the gain at any given moment. This particular value of gain input on line 31 is multiplied by the output of block 34 to produce an error signal on line 33. The output of line 32 is then the value of gain which has been changed as a result of the error signal generated in the feedback loop. The value of block 34 which is input to multiplier 35 changes dynamically with time. This dynamic changing and adjustment of the gain will be described in more detail with respect to the flow chart of FIG. 3.

As shown in step 41, the digitized samples received from A/D converter 16 are multiplied in signal processor 11 by the present gain value. In step 42, the maximum scaled sample product that has just been multiplied is then determined. As previously discussed, 16 samples are input at a time to signal processor 11. A determination is then made in decision block 43 as to whether the value of the maximum scaled sample product found in step 42 is greater than a predetermined maximum value which changes with time. If the maximum sample product is greater than this running maximum value, then as shown in step 44, a new running maximum value is set.

However, if the running max is greater than the maximum sampled value, or after a new running maximum is set, then a second determination is made in block 45 as to whether or not the running maximum value is less than a predetermined lower threshold value. If the running maximum is less than this lower threshold value, then the gain is adjusted proportionally to the amount by which the running maximum value is below this lower threshold value. As shown in block 46, the gain is adjusted upwards. However, if the running max is not less than the lower threshold, then a determination is made in block 47 as to whether or not the running max is greater than the upper threshold value. If the answer is yes, then as shown in block 48, the gain is adjusted downwards. However, if the running max is not greater than the upper threshold, then no adjustment to the gain is made. Finally, the running maximum value decreases with time as shown in block 49. This downward adjustment in the running max with time allows the proportional AGC mechanism described herein to track an incoming signal which slowly weakens in strength with increasing time. Consequently, the adjustments performed in blocks 46 and 48 to the gain depend upon the point in time at which the input samples are received by signal processor 11.

A confidence factor which changes with time is used to insure that the gain is updated much more aggressively when the digitized input samples are first received in order to lock in the incoming signal. The confidence factor and hence the gain is adjusted with time according to the following equations:

$$CONF = [(CONF\ INITIAL) \times (0.996)^T] + CONF\ FINAL$$
$$GAIN = GAIN - (MAX - UT) \times CONF, \text{ if } MAX > UT; \text{ and,}$$
$$GAIN = GAIN + (LT - MAX) \times CONF, \text{ if } MAX < LT.$$

where CONF is the confidence or scale factor (see blocks 46 and 48) which changes with time, T is the measure of time, MAX is the running maximum, GAIN is the gain factor, CONF INITIAL is the initial confidence value, CONF FINAL is the final confidence value, and LT and UT are the lower and upper threshold values.

The initial confidence value is predetermined and is chosen to be somewhat high compared to the final confidence value, however both values are less than 1. Thus, early in the acquisition process when CONF is quite large, the adjustment of the gain can be quite large. As time increases, the confidence factor CONF decreases in value and consequently changes in the GAIN are not quite as dramatic.

Figure 4:
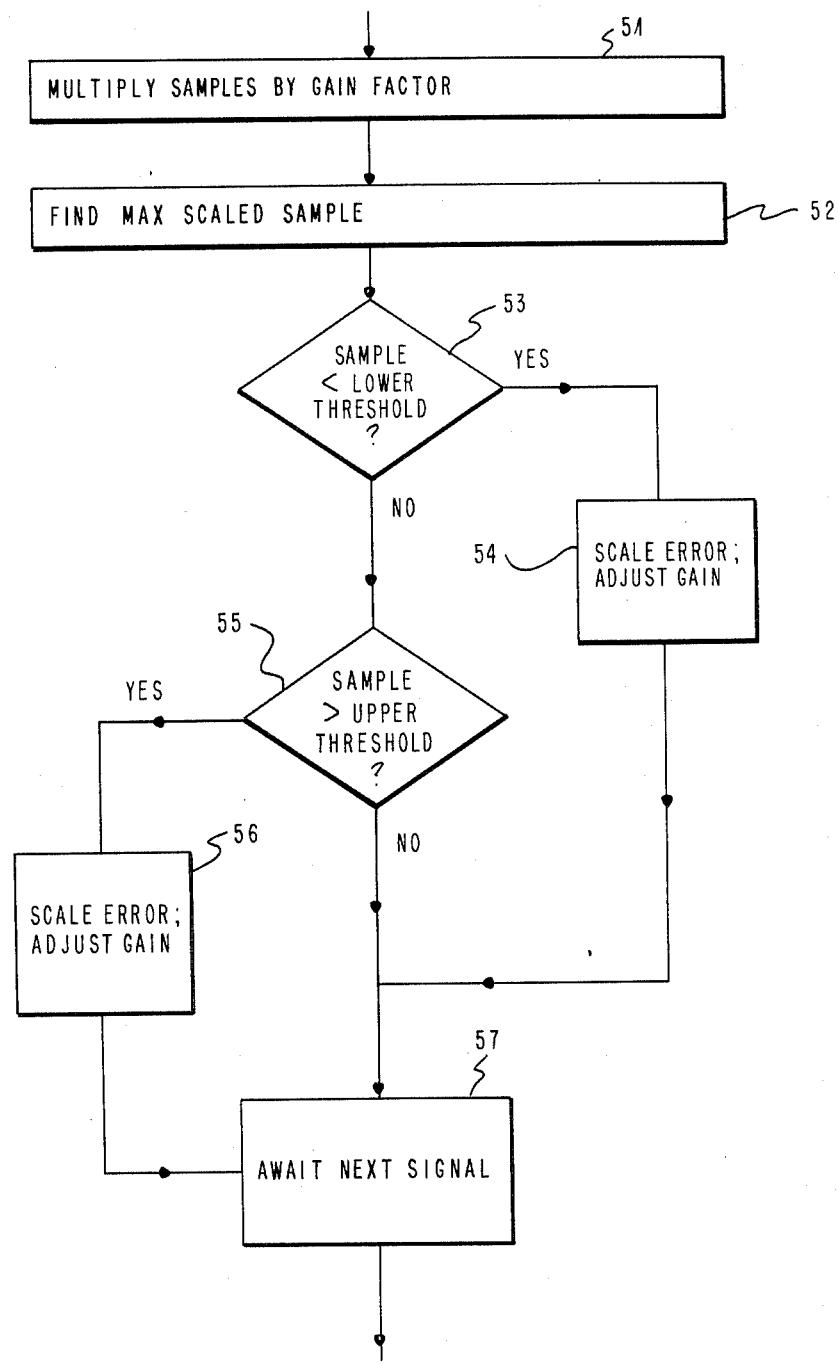
FIG. 4 is a flow chart depicting the operation of an alternative embodiment of the invention.

An alternative embodiment of the present invention is shown in FIG. 4. As described therein, the maximum scaled sample which is determined in block 52 after multiplying all the input samples by the gain factor in 51, is compared to the upper and lower threshold values. This is in contrast to the preferred embodiment wherein the maximum scaled sample is compared to a running maximum and the running maximum is adjusted if the maximum sampled product is greater than this running maximum. Also, instead of comparing the running maximum to the high and low threshold values, in the alternative embodiment, the maximum sampled product is compared to the threshold values. Consequently, in decision block 53 a determination is made as to whether or not the maximum sampled product is less than the lower threshold. If it is, then as shown in block 54, the gain will be adjusted upward as previously described. However, if the sample is greater than the lower threshold, then a determination is then made in block 54 as to whether or not the maximum sample is greater than the upper threshold. If it is, then as shown in step 56, the gain is adjusted upwards. Finally in step 57, the next sampled signal is awaited. The equations used to describe the change in gain and the confidence factor for the preferred embodiment are slightly altered for the alternative embodiment. In the alternative embodiment, the running maximum value in the two gain equations is replaced with the maximum scaled sample value. All other variables in the equations remain the same.

While the invention has been particularly shown and described with reference to a preferred embodiment it will be understood by those skilled in the art that various other changes in form and detail may be made without departing from the spirit and scope of the invention.

What is claimed is:

1. A method of providing automatic gain control of input signals in a signal processor, said method comprises the steps of:
   establishing an automatic gain control value;
   receiving a plurality of samples representing an input signal;
   multiplying each of said plurality of samples by said automatic gain control value, thereby generating a plurality of sample products;
   comparing a maximum one of said sample products with a running maximum value;
   adjusting said running maximum value subsequent to said maximum sample product being greater than said running maximum value; and
   adjusting said automatic gain control value subsequent to said running maximum value lying outside a predetermined range of values.

2. The method as recited in claim 1 further comprises the step of decreasing said running maximum value subsequent to said step of adjusting said automatic gain control value, thereby enabling the tracking of said input signal.

3. The method as recited in claim 2 wherein said predetermined range of values includes an upper threshold value and a lower threshold value.

4. The method as recited in claim 3 wherein the step of adjusting the automatic gain control value comprises the step of increasing said automatic gain control value subsequent to said running maximum value being less than said lower threshold value.

5. The method as recited in claim 4 wherein said automatic gain control value is increased according to the equation, $$GAIN = GAIN + (LT - MAX) \times CONF,$$

wherein GAIN is the automatic gain control value, LT is the lower threshold value, MAX is the running maximum value, and CONF is a scale factor which changes with time.

6. The method as recited in claim 5 wherein said confidence factor is described by the equation, $$CONF = [(CONF\ INITIAL) \times (0.996)^T] + CONF\ FINAL,$$

wherein T is time, CONF INITIAL and CONF FINAL are initial confidence factor values less than 1, and wherein CONF INITIAL is much greater than CONF FINAL.

7. The method as recited in claim 3 wherein said step of adjusting the automatic gain control value further comprises the step of decreasing said automatic gain control value subsequent to said running maximum value being greater than said upper threshold value.

8. The method as recited in claim 7 wherein said automatic gain control value is decreased according to the equation, $$GAIN = GAIN - (MAX - UT) \times CONF,$$

wherein GAIN is the automatic gain control value, MAX is the running maximum value, UT is the upper threshold value, and CONF is a scale factor which changes with time.

9. The method as recited in claim 8 wherein said confidence factor is described by the equation, $$CONF = [(CONF\ INITIAL) \times (0.996)^T] + CONF\ FINAL,$$

wherein T is time, CONF INITIAL and CONF FINAL are initial confidence factor values less than 1, and wherein CONF INITIAL is much greater than CONF FINAL.

10. In a signal processor, apparatus for providing automatic gain control, comprising:
  means for establishing an automatic gain control value;
  means for receiving a plurality of samples representing an input signal;
  means for multiplying each of said plurality of samples by said automatic gain control value, thereby generating a plurality of sample products;
  means for comparing a maximum one of said sample products with a running maximum value;
  means for adjusting said maximum value subsequent to said maximum sample product being greater than said running maximum value; and
  means for adjusting said maximum value subsequent to said running maximum value lying outside a predetermined range of values.

11. The apparatus as recited in claim 10 further comprises means responsive to said automatic gain control adjusting means for decreasing said running maximum value, thereby enabling the tracking of said input signal.

12. The apparatus as recited in claim 11 wherein said predetermined range of values includes an upper threshold value and a lower threshold value.

13. The apparatus as recited in claim 12 wherein said automatic gain control value adjusting means comprises means for increasing said automatic gain control value subsequent to said running maximum value being less than said lower threshold value.

14. The apparatus as recited in claim 13 wherein said automatic gain control value is increased according to the equation, $$GAIN = GAIN + (LT - MAX) \times CONF,$$

wherein GAIN is the automatic gain control value, LT is the lower threshold value, MAX is the running maximum value, and CONF is a scale factor which changes with time.

15. The apparatus as recited in claim 14 wherein said confidence factor is described by the equation, $$CONF = [(CONF\ INITIAL) \times (0.996)^T] + CONF\ FINAL,$$

wherein T is time, CONF INITIAL and CONF FINAL are initial confidence factor values less than 1, and wherein CONF INITIAL is much greater than CONF FINAL.

16. The apparatus as recited in claim 12 wherein said the automatic gain control value adjusting means further comprises means for decreasing said automatic gain control value subsequent to said running maximum value being greater than said upper threshold value.

17. The apparatus as recited in claim 16 wherein said automatic gain control value is decreased according to the equation, $$GAIN = GAIN - (MAX - UT) \times CONF,$$

wherein GAIN is the automatic gain control value, MAX is the running maximum value, UT is the upper threshold value, and CONF is a scale factor which changes with time.

18. The apparatus as recited in claim 17 wherein said confidence factor is described by the equation, $$CONF = [(CONF\ INITIAL) \times (0.996)^T] + CONF\ FINAL,$$

wherein T is time, CONF INITIAL and CONF FINAL are initial confidence factor values less than 1, and wherein CONF INITIAL is much greater than CONF FINAL.

* * * * *